(12) United States Patent
Wallace et al.

(10) Patent No.: US 10,055,125 B2
(45) Date of Patent: Aug. 21, 2018

(54) ON-BOARD CHIP READER ADAPTER (OCRA)

(71) Applicant: S34A, INC., Reston, VA (US)

(72) Inventors: Henry B. Wallace, Fincastle, VA (US); David Sun, Great Falls, VA (US)

(73) Assignee: S34A, Inc., Reston, VA (US)

( * ) Notice: Subject to any disclaimer, the term of this patent is extended or adjusted under 35 U.S.C. 154(b) by 0 days.

(21) Appl. No.: 14/716,866

(22) Filed: May 19, 2015

(65) Prior Publication Data

US 2015/0331629 A1 Nov. 19, 2015

Related U.S. Application Data

(60) Provisional application No. 62/000,475, filed on May 19, 2014.

(51) Int. Cl.
| | |
|---|---|
| *G06F 12/00* | (2006.01) |
| *G06F 3/06* | (2006.01) |
| *G11C 5/02* | (2006.01) |
| *G11C 7/22* | (2006.01) |
| *G11C 29/02* | (2006.01) |

(52) U.S. Cl.
CPC ............. *G06F 3/06* (2013.01); *G06F 3/0619* (2013.01); *G06F 3/0658* (2013.01); *G06F 3/0673* (2013.01); *G11C 5/02* (2013.01); *G11C 7/22* (2013.01); *G11C 29/02* (2013.01)

(58) Field of Classification Search
CPC ........ G06F 3/06; G06F 3/0619; G06F 3/0658; G06F 3/0673; G11C 5/02; G11C 7/22; G11C 29/02
See application file for complete search history.

(56) References Cited

U.S. PATENT DOCUMENTS

| | | | |
|---|---|---|---|
| 2011/0041005 A1 | 2/2011 | Selinger | |
| 2012/0257436 A1* | 10/2012 | Lee | G11C 11/1673 365/148 |
| 2014/0006903 A1 | 1/2014 | Bybell | |
| 2014/0310445 A1 | 10/2014 | Fitzpatrick et al. | |
| 2014/0317479 A1 | 10/2014 | Candelaria | |
| 2015/0227312 A1* | 8/2015 | Feehrer | G06F 3/061 710/22 |

* cited by examiner

*Primary Examiner* — Shawn X Gu
(74) *Attorney, Agent, or Firm* — Terry M. Sanks, Esq.; Beusse Wolter Sanks & Maire, PLLC

(57) ABSTRACT

A device to read data stored on a memory device of a printed circuit board (PCB) while the memory device is installed on the PCB is disclosed, including, a microcontroller to control acquiring memory data from the memory device when a processor on the PCB is in an idle state, and a resistance measurement and signal driver to measure the resistances of the signals controlling a memory device and to read the memory data from the memory. A method and system are also disclosed.

17 Claims, 6 Drawing Sheets

ON-BOARD CHIP READER ADAPTER (OCRA)

CROSS-REFERENCE TO RELATED APPLICATIONS

This application claims the benefit of U.S. Provisional Application 62/000,475 filed May 19, 2014, incorporated herein by reference in its entirety.

FIELD OF THE DISCLOSURE

Embodiments generally relate to data readers and more particularly to data readers for accessing installed memory.

BACKGROUND

The statements in this section merely provide background and may not constitute prior art.

Existing methods of reading data stored on a memory device are laden with inaccuracies and inefficiencies. Often, memory devices are connected to communications networks and can accumulate significant amounts of data in the course of their operation. Among others, forensics examiners find this data valuable in criminal and accident investigations, but accessing memory modules or devices is often difficult. To maintain the integrity of the evidence or other subject devices, forensic examiners and others seek to access data stored in memory without removing or otherwise permanently altering the computing device containing the target memory module.

Memory devices may be non-volatile devices such as a flash-based memory module, hard drive disks, a ROM module, an EEPROM module and the like. Memory devices may also be volatile memory storage devices which require power to maintain the information stored on the device such as in a RAM module. In the case of accessing volatile memory, maintaining power to the memory module (e.g., a RAM module) is best done by the native system.

Most electronic assemblies are configured such that the memory devices are soldered to a printed circuit board (PCB). These memory devices are typically not easily accessible and cannot be accessed while installed on the PCB. This necessitates the desoldering of the memory device from the PCB in order to read the data it contains. This frustrates the work of individuals seeking to read the data, such as criminal and accident investigators, because it causes a time-consuming task to impede the access to said data.

Given the foregoing, what is needed are devices and methods that allow data stored on a memory device to be read while it remains installed on a PCB.

SUMMARY

This Summary is provided to introduce a selection of concepts. These concepts are further described below in the Detailed Description section. This Summary is not intended to identify key features or essential features of the subject matter disclosed herein, nor is this Summary intended as an aid in determining the scope of the disclosed subject matter.

Embodiments relate to a device, a system and a method to facilitate reading data from a memory device while the memory device is installed on a printed circuit board (PCB). The device comprises a microcontroller to control acquiring memory data from the memory device when a processor on the PCB is in an idle state, and a resistance measurement and signal driver to measure the resistances of the signals controlling a memory device and to read the memory data from the memory.

The method comprises monitoring a processor on a PCB for an idle condition by monitoring signals connected from it to a memory device, and then reading the memory device when the processor is idle. The method also comprises measuring pin resistances of signals controlling a memory device on the PCB with the reader, and determining with the reader if all of the resistances are greater than or equal to a critical resistance. If all resistances are greater than the critical resistance, the method further provides for reading data from the memory device with the reader.

The system comprises a device to read data stored on a memory device of a printed circuit board (PCB) while the memory device is installed on the PCB. The system further comprises a controller to control acquiring memory data from the memory device when a processor on the PCB is in an idle state. The system also comprises a storage device to store acquired memory from the memory device.

BRIEF DESCRIPTION OF THE DRAWINGS

A more particular description briefly stated above will be rendered by reference to specific embodiments thereof that are illustrated in the appended drawings. Understanding that these drawings depict only typical embodiments and are not therefore to be considered to be limiting of its scope, the embodiments will be described and explained with additional specificity and detail through the use of the accompanying drawings in which:

FIG. 3 is a circuit diagram depicting an embodiment of a circuit configured to determine the driving resistance of a processor signal located in a PCB that the targeted memory device is installed on;

DETAILED DESCRIPTION

Figure 1:
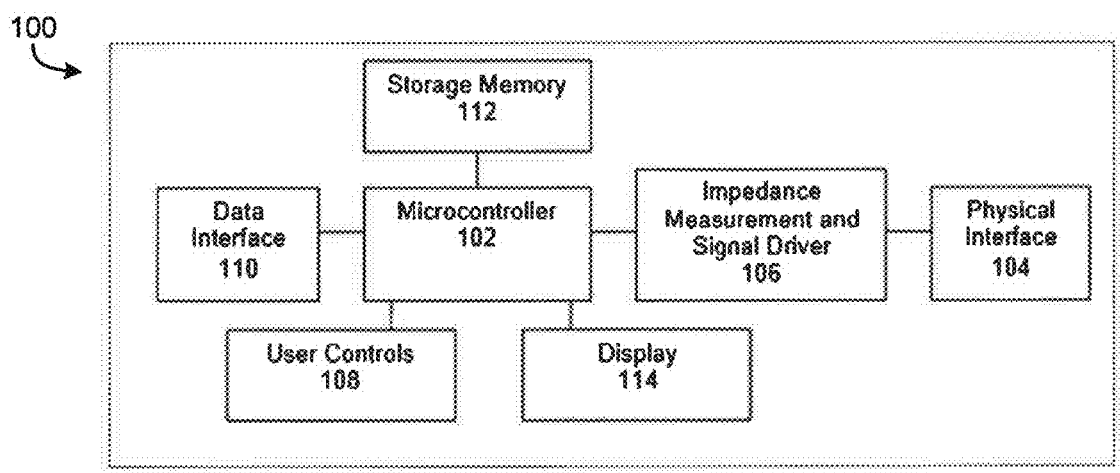
FIG. 1 is a block diagram of an embodiment of an OCRA device.

Embodiments are described herein with reference to the attached figures wherein like reference numerals are used throughout the figures to designate similar or equivalent elements. The figures are not drawn to scale and they are provided merely to illustrate aspects disclosed herein. Several disclosed aspects are described below with reference to non-limiting example applications for illustration. It should be understood that numerous specific details, relationships, and methods are set forth to provide a full understanding of the embodiments disclosed herein. One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. The embodiments are not limited by the illustrated ordering of acts or events, as some acts may occur in different orders and/or concurrently with other acts or events. Furthermore, not all illustrated acts or events are required to implement a methodology in accordance with the embodiments.

Notwithstanding that the numerical ranges and parameters setting forth the broad scope are approximations, the numerical values set forth in specific non-limiting examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 4.

Embodiments are directed to devices and methods which facilitate reading data from a memory device while the memory device is installed on a printed circuit board (PCB). Aspects disclosed herein provide devices and methods, which facilitate the reading of memory data from devices without requiring any desoldering of memory modules contained therein. This is done via an on-board chip reader adapter (OCRA) capable of reading data stored on a memory device while the memory device is installed on a PCB. OCRA is interchangeable with "device," "system" and "reader". In some instances OCRA device is also used. As used herein, the PCB may be contained within a target computing device, thereby enabling forensic examiners, data recovery specialists, computer technicians and others to recover, manipulate, or otherwise access the data contained on the memory device.

The term "memory device" and/or the plural form of this term are used throughout herein to refer to any computing device, portion of a computing device, memory module, or other device apparent to those skilled in the relevant art(s) after reading the description herein capable of storing data including, but not limited to, leaded devices, such as small outline package (SOP), mini small outline package (MSOP), thin shrink small outline package (TSSOP), thin small outline package (TSOP), dual in-line package (DIP), and others, as well as ball grid array (BGA) style memories and small lead count memories.

Referring now to FIG. 1, a block diagram of an embodiment of the OCRA device 100 is shown. The OCRA device 100 may be utilized to access data contained within a memory or memory device. In some aspects, the memory device is accessed in-situ. That is, the OCRA device 100 may be utilized to access data from a memory device while the memory device remains soldered into the PCB or another portion of a computing device. In an aspect, the OCRA device may comprise a microcontroller 102, a physical interface 104, a resistance measurement and signal driver 106, user controls 108, a data interface 110, integrated storage memory 112 and a display 114. In various aspects, one or more of such portions may be omitted (e.g., where the OCRA device 100 may be a portion of another computing device). In some aspects, the OCRA device 100 may be a stand-alone device and further includes a power supply. A stand-alone OCRA device 100 may be used to access data from a target memory device and store the accessed data within the OCRA device 100 for later analysis.

A microcontroller 102 may control all of the processes that are performed by the OCRA device 100. These processes may include, but are not limited to, reading, storing, and sending data read from the targeted memory device. The microcontroller 102 contains one or more modules containing instructions which execute processes 600 and 700, described below. The microcontroller 102 is communicatively coupled to other portions of the OCRA device 100.

Physical interface 104 is where the OCRA device 100 physically connects to the pins or other interface points of the target memory device. In some aspects, the physical interface 104 may be a series of leads. In an aspect, the physical interface 104 may be a commercial adapter configured to contact the lead of a leaded memory device, such as SOPs, MSOPs, TSSOPs, TSOPs, and the like.

Figure 2:
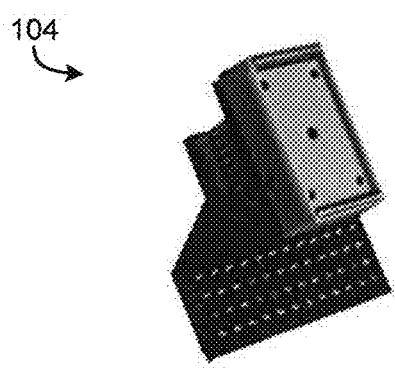
FIG. 2 is an image of an embodiment of a physical interface for use with an OCRA device.

FIG. 2 depicts a commercial adapter which may be utilized as physical interface 104 in order to access TSOP-48 type memory devices. The resistance measurement and signal driver module 106 performs the processes of measuring pin resistances of the memory device and reading the data from the memory device. The module 106 contains one or more circuits described herein which determine the resistance of portions of the target computing device containing the memory device to be accessed, thereby facilitating access of the data contained therein.

In some aspects, the OCRA device 100 may comprise user controls 108, or a control interface. When the OCRA device 100 is connected to a receiving computing device (e.g., a computing device a forensic examiner wishes to store data from the target memory device on), the user controls 108 may be start and stop buttons. Where the OCRA device 100 is a stand-alone device, the user controls 108 may include more sophisticated controls such as a touch screen interface overlaid on a display 114, a keyboard (not shown), and the like. The user controls 108 may be used to initiate and terminate the OCRA device 100 processes and monitor other aspects of the OCRA device 100, such as, but not limited to, its functionality and operation.

A data interface 110 may be provided to enable accessed data to be transferred to another computing device, off site database, or the like. In some aspects, the data interface 110 may be a USB port or similar physical data connection. In other aspects, the data interface 110 may be a wireless data transmission interface, such as a Bluetooth® chip (a wireless technology standard standardized as IEEE 802.15.1) or the like. As will be apparent to those skilled in the relevant arts after reading the description herein, other data interfaces may be used. Furthermore, the OCRA device 100 may have multiple data interfaces 110.

In some aspects, the OCRA device 100 may comprise an onboard storage memory 112 device. The storage memory 112 may store data accessed from the target memory device by the OCRA device 100.

The display 114 disclosed above may also provide a visual indication of the state of the OCRA device 100 and processes being carried out by the OCRA device 100. The display 114 may be a small liquid crystal display, an LED, an LED array, or the like. In some aspects, the display 114 may be omitted and display functionality is handled by an attached computing device which directs the operation of the OCRA device 100.

Figure 3:
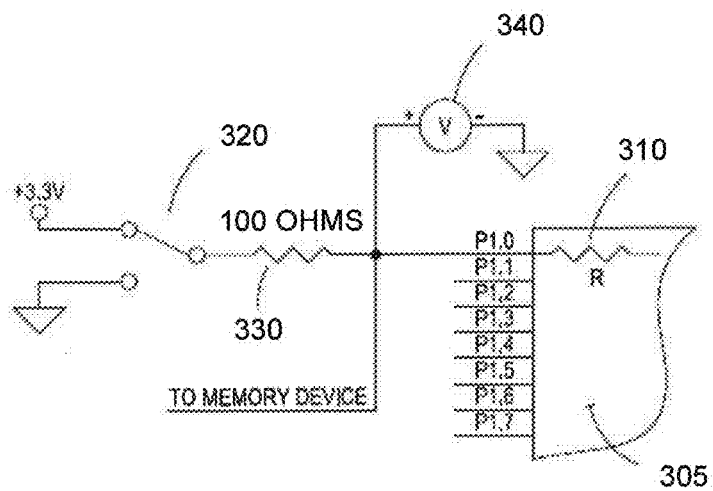

Referring now to FIG. 3, a circuit diagram 300 depicts an embodiment of a circuit contained within the OCRA device 100 provided to determine the resistance on a processor signal located in the PCB that the targeted memory device is installed on. In some aspects, the circuit of FIG. 3 is housed within the resistance measurement and signal driver 106 and is used to determine if the processor 305 on the PCB containing the memory device has low resistance signals connected to the memory data to be read. The existence of such a low resistance poses a problem because in this situation, even if the processor is idle, it becomes difficult to drive each signal to a proper state.

Most modern high-speed processors generally include a series resistor that is 20 to 50 ohms in order to minimize signal ringing, electromagnetic radiation, and degradation. This resistance provides a degree of isolation between the processor and the devices it is connected to, including the targeted memory device. This resistance is low enough to make reading data from the memory device problematic. To determine the value of this resistance on a processor signal, a resistor of about 100 to 500 ohms may be connected, and voltages in the circuit may be measured under one or two logic states.

As a non-limiting example, assume that the processor 305 has a series resistor 310 of value R connected to pin P1.0, and that the output voltage is zero volts without the test circuit connected. With the switch 320 connected to the +3.3V DC supply voltage as shown, and a current limiting resistor 330 of value 100 ohms, the voltage on a voltmeter 340 connected to the pin P1.0 reads 0.66V DC (as a non-limiting example). The value of R is then (100*0.66)/(3.3−0.66)=25 ohms. If the processor pin P1.0 were high, then the switch would be set in the ground position and a similar measurement and computation made. If the processor pin P1.0 shows some intermediate open circuit voltage, this can be taken into account in the computations using Ohm's law.

As a non-limiting example, measurement may be performed with an understanding of Thevenin equivalent circuits and is well known to practitioners of the art. If the processor pin P1.0 is normally in a high impedance state (typically 100,000 ohms or more), then it provides no impediment to reading an attached memory device. This resistance measurement can be performed by using the circuit in FIG. 4.

Figure 4:
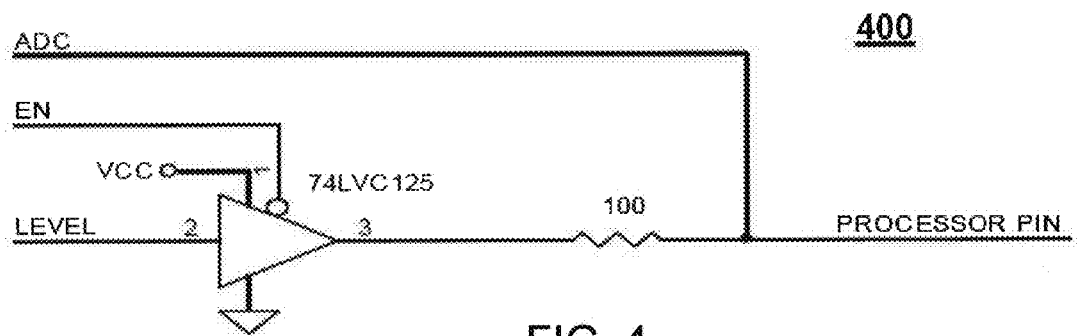
FIG. 4 is a circuit diagram of an resistance measurement portion of an OCRA device, configured to measure the resistance of a portion of a target processor on a PCB.

Referring now to FIG. 4, a circuit diagram 400 depicting an embodiment of a circuit that provides a resistance measurement needed for the proper functionality of the OCRA device 100 is shown. The driver depicted in FIG. 4 is, by way of a non-limiting example, a type 74LVC125, that provides two voltage levels according to the state of the LEVEL signal. The driver is enabled when needed using an enable (EN) signal. The 100 ohm resistor provides the same functionality as the one in FIG. 3. An analog to digital converter (ADC) measures the voltage on the PROCESSOR PIN. A voltage of a power supply (VCC) providing power for the driver should be the same voltage as the voltage on the processor signal being measured. The signals ADC, EN, and LEVEL are connected to the microcontroller 102 conducting the measurement. Once it has been determined that a processor signal has a finite series resistance such as, but not limited to, more than 10 ohms, a circuit is connected to overdrive the signal and force it into a state required to read the targeted memory device. This circuit is the signal driver portion of the module 106 in the OCRA device 100 block diagram and is detailed further in FIG. 5. The 10 ohms resistance limit could be somewhat higher or lower depending on the specific application; this limit is called the critical resistance.

Figure 5:
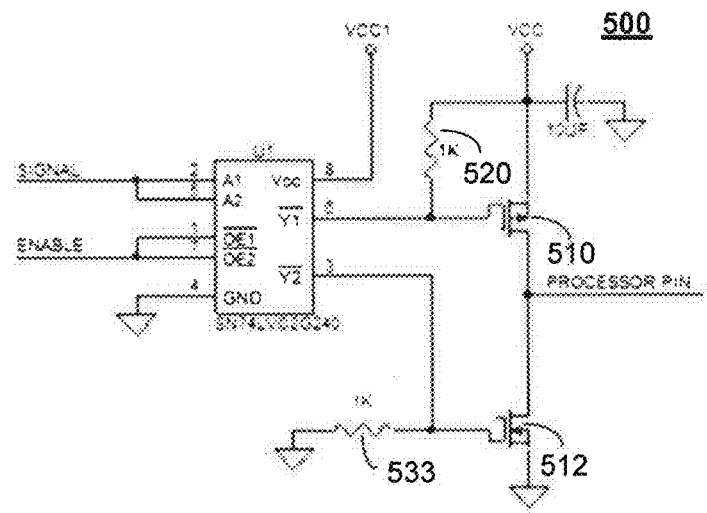
FIG. 5 is a circuit diagram depicting components that comprise the signal driver of an OCRA device.

Referring now to FIG. 5, a circuit diagram 500 depicting the components that comprise the signal driver 106 housed in the OCRA device is shown. Two MOSFETs 510, 512 comprise a low resistance totem pole driver, powered by VCC which is the same voltage as that powering the targeted memory device. A dual inverter U1 may be, but is not limited to, a SN74LVCG240 type, and has a tri-state control on an OE1 input and an OE2 input. The 1 k resistors 520, 522 functions to turn off the MOSFETs 510, 512 when the inverter U1 is tri-stated. The inverter U1 is powered by voltage VCC1, which is higher than VCC. When the need to overdrive the PROCESSOR PIN is present, a SIGNAL line is placed into a desired state and an ENABLE line is driven low. This turns on the inverters of U1, which control the MOSFETs 510, 512 to provide the proper output level. When the ENABLE line is driven high, both U1 and the MOSFETs 510, 512 turn off, allowing the PCB processor to control the PROCESSOR PIN normally. The output resistance of this driver is a fraction of an ohm and thus does not have a problem overdriving signal resistances at the PROCESSOR PIN of 10 ohms or higher.

Figure 6:
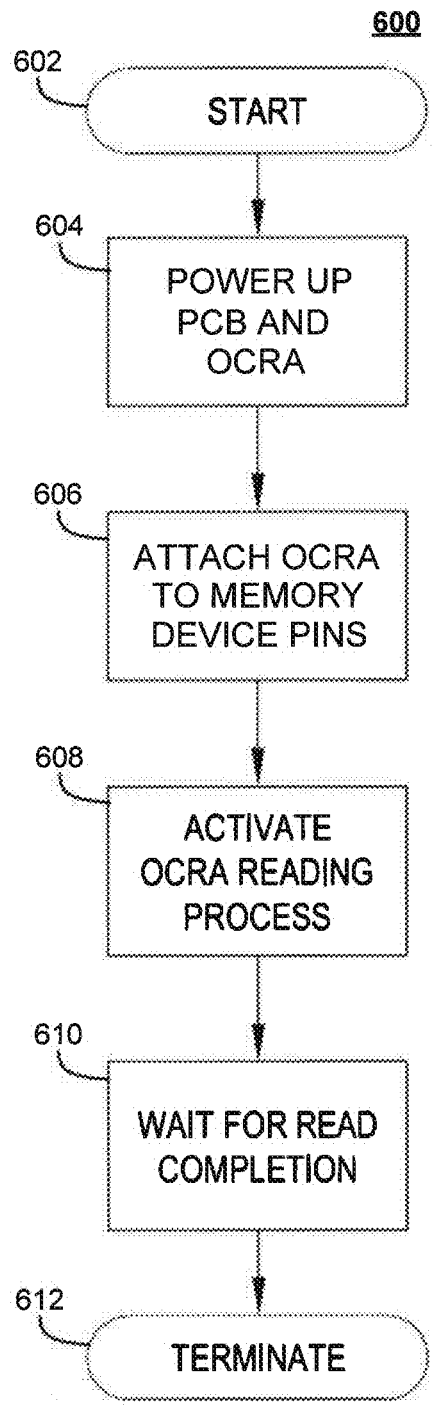
FIG. 6 is a flowchart illustrating an exemplary process for reading data from a memory device while it is installed on a PCB, without desoldering said device from the PCB, performed by utilizing the OCRA.
Figure 7:
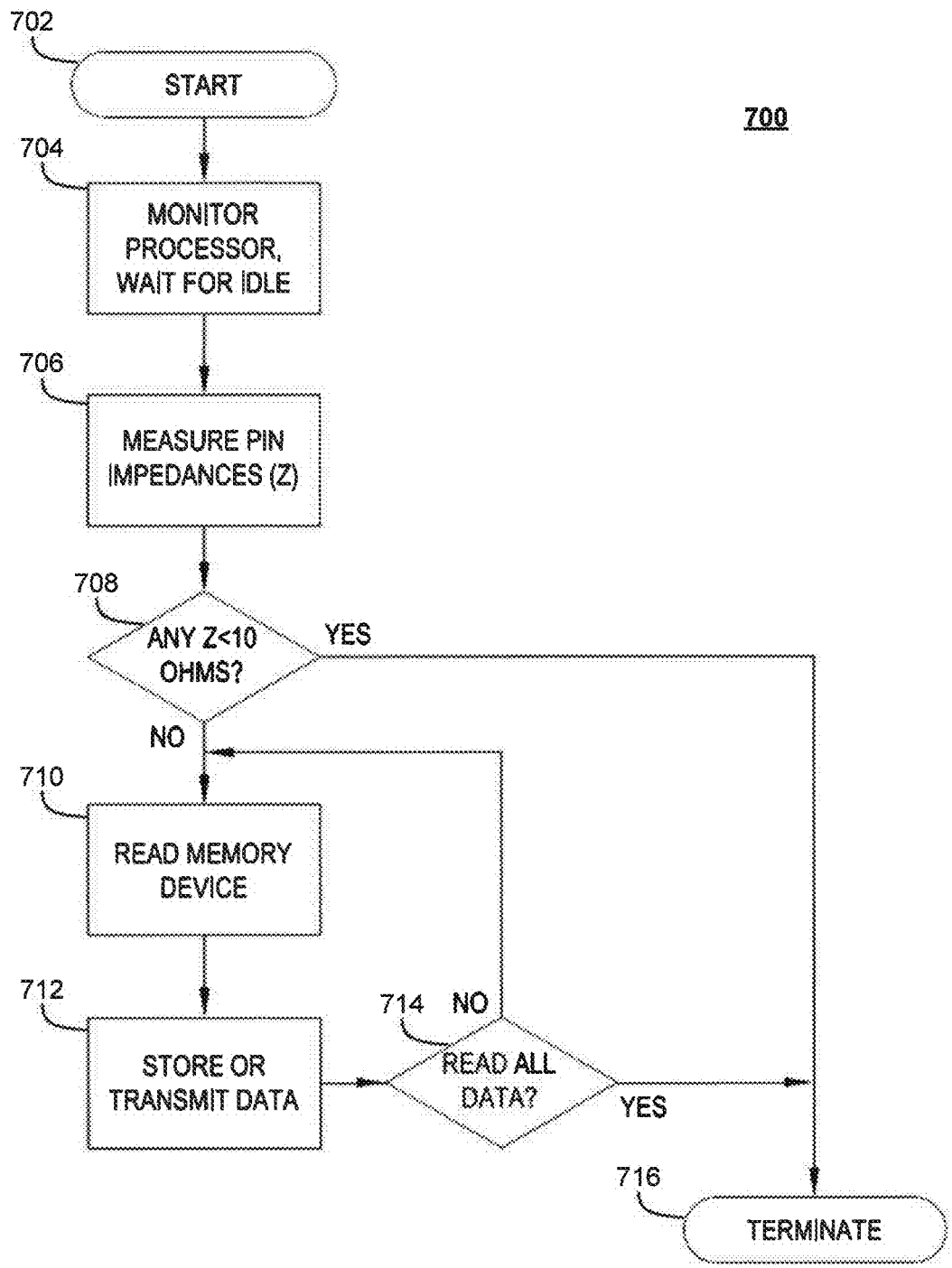
FIG. 7 is a flowchart illustrating an exemplary process for how the OCRA device reads data from a memory device.

Referring now to FIG. 6, a flowchart illustrating an exemplary process 600 for reading data from a memory device while it is installed on a PCB without desoldering said device from the PCB, performed by utilizing OCRA device 100, according to an aspect of the present disclosure, is shown. The process 600, which facilitates reading data from a memory device installed on a. PCB without desoldering said device by utilizing the OCRA device 100, begins at step 602 with control passing immediately to step 604. At step 604, both the target computing device and the OCRA device 100 are powered on, such as, but not limited to, by the user. The target computing device includes the memory device the user wishes to access and may be a PCB. At 606, the OCRA device 100 is physically attached, such as, but not limited to, by a user, to a memory device installed on a PCB. In an aspect, a physical interface 104 is placed over an integrated circuit, the integrated circuit being the target memory device. At step 608, the OCRA device 100 is activated, such as by the user, such as, but not limited to, by use of a start push button on the OCRA device 100. In aspects where the OCRA device 100 is not a stand-alone device, a controller computing device may activate the OCRA reading process by sending an activate instruction to the OCRA device 100 via data interface 110. The OCRA reading process utilizes circuits described herein to match supply voltages (well understood by practitioners of the art), and drive the appropriate voltages to the target memory device. As disclosed in further detail below, FIG. 7 depicts an exemplary process for reading the target memory device. At step 610, the OCRA device 100 reads the data from the memory device. A display on the OCRA device 100 may signal, such as, but not limited to, the user, when the OCRA device 100 is done with this process. The process 600 terminates at step 612.

Referring now to FIG. 7, a flowchart illustrating an exemplary process 700 for how the OCRA device 100 reads data from a memory device is shown. The process 700, which may execute within process 600 and facilitate reading data from a memory device via the OCRA device 100 begins at step 702 with control passing immediately to step 704. At step 704, the OCRA device 100 monitors the processor attached to the same the PCI3 as the memory device and waits for it to enter an idle state. Once this happens, control passes to step 706. At step 706, the OCRA device 100 measures the pin resistances of the processor signals via module 106. At step 708, the OCRA device 100 determines if any of the resistances found at step 706 are less than the critical resistance, typically but not limited to 10 ohms. If no resistances are less than the critical resistance, step 710 executes. If resistances are above the critical resistance, process 700 executes step 716 and terminates. At step 710, the OCRA device 100 reads the data from the memory device. At step 712, the OCRA device 100 either transmits or stores the data, depending on how the system is configured. At step 714, the OCRA device 100 makes a determination whether all of the data has been read. If the answer is negative, control returns immediately to step 710. If the answer is in the affirmative, control passes to step 716 and process 700 terminates.

Figure 8:
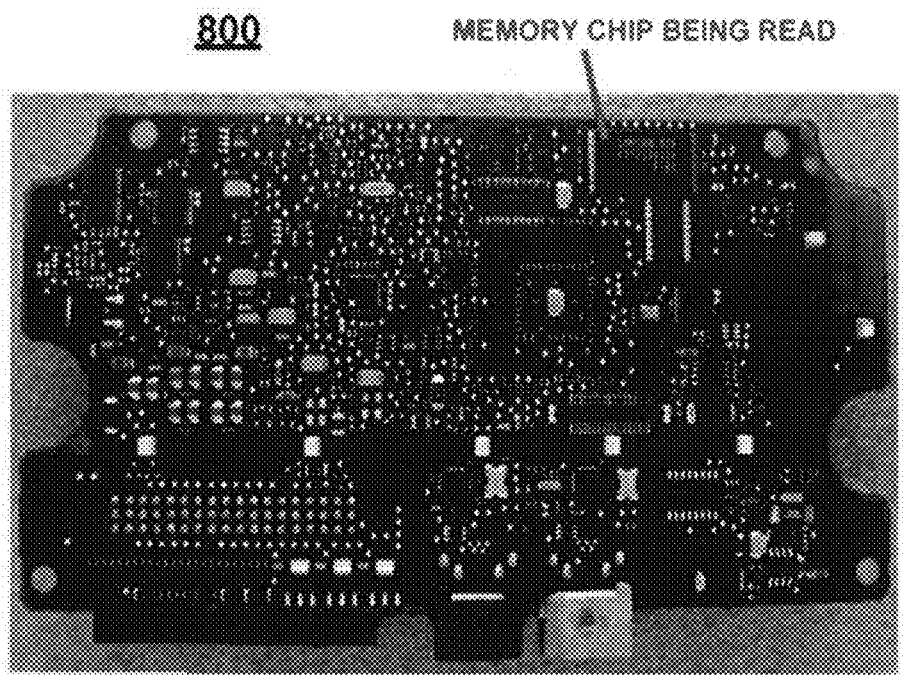
FIG. 8 is an image of a PCB and a memory device which may be accessed with an OCRA device.
Figure 9:
FIG. 9 is an image of an OCRA device attached to a memory device.

Referring briefly now to FIG. 8, an image showing an embodiment of the PCB and the memory device which may be accessed with the OCRA device 100 is shown. Referring briefly now to FIG. 9, an image of OCRA device 100 attached to a memory device, according to an aspect of the present disclosure, is shown.

Figure 10:
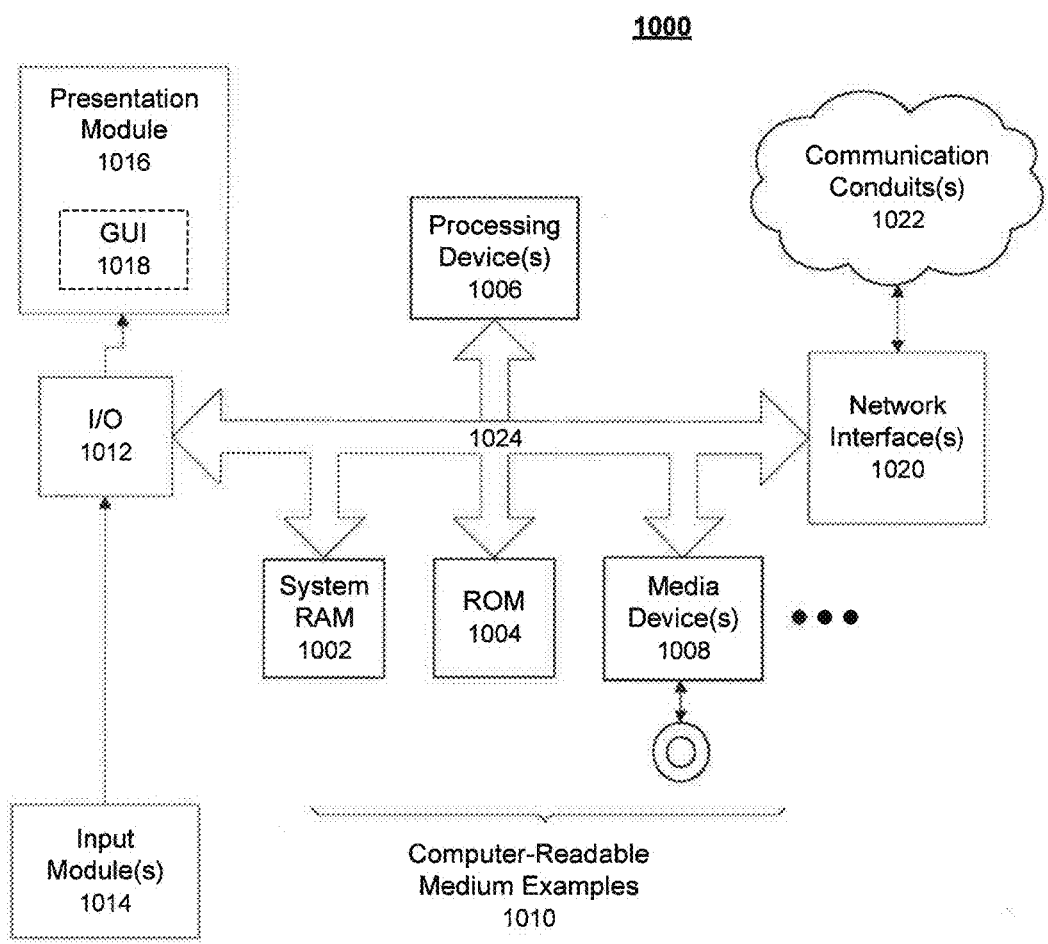
FIG. 10 is a block diagram of an embodiment of a computing system useful for implementing aspects of an embodiment disclosed herein.
Figure 10:

Referring now to FIG. 10, a block diagram of an exemplary computer system useful for implementing various aspects of the processes disclosed herein, in accordance with one or more aspects of the present disclosure, is shown. That is, FIG. 10 sets forth illustrative computing functionality 1000 that may be used to implement aspects of the PCB, target memory device, OCRA device 100, microcontroller 102, driver 106, and the like. In all cases, computing functionality 1000 represents one or more physical and tangible processing mechanisms. Computing functionality 1000 may comprise volatile and non-volatile memory, such as RAM 1002 and ROM 1004, as well as one or more processing devices 1006 ((e.g., one or more central processing units (CPUs), one or more graphical processing units (GPUs), and the like)). Computing functionality 1000 also optionally comprises various media devices 1008, such as a hard disk module, an optical disk module, and so forth. Computing functionality 1000 may perform various operations identified above when the processing device(s) 1006 execute(s) instructions that are maintained by memory (e.g., RAM 1002, ROM 1004, and the like).

More generally, instructions and other information may be stored on any computer readable medium 1010, including, but not limited to, static memory storage devices, magnetic storage devices, and optical storage devices. The term "computer readable medium" also encompasses plural storage devices. In all cases, computer readable medium 1010 represents some form of physical and tangible entity. By way of example, and not limitation, computer readable medium 1010 may comprise "computer storage media" and "communications media."

"Computer storage media" comprises volatile and non-volatile, removable and non-removable media implemented in any method or technology for storage of information, such as computer readable instructions, data structures, program modules, or other data. Computer storage media may be, for example, and not limitation, RAM 1002, ROM 1004, EEPROM, Flash memory, or other memory technology, CD-ROM, digital versatile disks (MD), or other optical storage, magnetic cassettes, magnetic tape, magnetic disk storage, or other magnetic storage devices, or any other medium which can be used to store the desired information and which can be accessed by a computer.

"Communication media" typically comprise computer readable instructions, data structures, program modules, or other data in a modulated data signal, such as carrier wave or other transport mechanism. Communication media may also comprise any information delivery media. The term "modulated data signal" means a signal that has one or more of its characteristics set or changed in such a manner as to encode information in the signal. By way of example, and not limitation, communication media comprises wired media such as a wired network or direct-wired connection, and wireless media such as acoustic, RF, infrared, and other wireless media. Combinations of any of the above are also included within the scope of computer readable medium.

The computing functionality 1000 may also comprise an input/output module 1012 for receiving various inputs (via input modules 1014), and for providing various outputs (via one or more output modules). One particular output module mechanism may be a presentation module 1016 and an associated graphical user interface (GUI) 1018. The computing functionality 1000 may also include one or more network interfaces 1020 for exchanging data with other devices via one or more communication conduits 1022. In some embodiments, one or more communication buses 1024 communicatively couple the above-described components together.

The communication conduit(s) 1022 may be implemented in any manner (e.g., by a local area network, a wide area network (e.g., the Internet), and the like, or any combination thereof). At least one communication conduit 1022 may include any combination of hardwired links, wireless links, routers, gateway functionality, name servers, and the like, governed by any protocol or combination of protocols.

Alternatively, or in addition, any of the functions described herein may be performed, at least in part, by one or more hardware logic components. For example, without limitation, illustrative types of hardware logic components that may be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), and the like.

The terms "module" and "component" as used herein generally to represent software, firmware, hardware, or combinations thereof. In the case of a software implementation, the module or component represents program code that performs specified tasks when executed on a processor. The program code may be stored in one or more computer readable memory devices. The features of the present disclosure described herein are platform-independent, meaning that the techniques can be implemented on a variety of commercial computing platforms having a variety of processors (e.g., set-top box, desktop, laptop, notebook, tablet computer, personal digital assistant (PDA), mobile telephone, smart telephone, gaming console, and the like).

The OCRA concepts and methods can be applied to more than just reading memory devices or elements. Any type of logic manipulation requiring interfacing to an existing, powered circuit can be performed, consistent with the signal impedance limitations.

As an aid to proper attachment of the adapter, tests for short and open circuits may be performed, with feedback provided to the user. Also, self test functions are beneficial. A self test of the circuitry while unattached to a PCB target will expose shorted pins, perhaps due to short circuits in the adapter or connections thereto. A simple loopback device may also be connected to the adapter to allow verification of connection continuity. These tests run in only seconds and serve to give the user confidence that the OCRA system is in running form before attachment to a target PCB.

Information collected by the OCRA regarding signal impedances on a particular PCB may be useful, and may be stored for future reference.

The OCRA system may also be used to collect information on the processor, such as recording digital or analog signal histories, stored for later analysis. It may also be used to record signature information on the processor activity, such as the spectra of signals, time domain information (frequency, period, duty cycle), and activity by time of day, among other information. This information may be useful for reverse engineering activities, or for monitoring a processor to detect out of the ordinary activity, such as the operation of malware or viruses.

The OCRA may also be used to modify the code running on the processor, as a non-limiting example, to inject code into the processor to detect the presence of malware or viruses, or prevent such programs from being loaded or run. The only change to the system and methods above is the addition of a write operation on the memory of interest, an operation well understood by practitioners of the art.

Several general advantages of this invention include, but are not limit to data may be read from a memory device in most cases while it is still soldered to its host PCB; devices other than memory may be accessed and manipulated as well; the PCB is not permanently altered in any significant way, and this method is considered nondestructive; data may be read from the memory device at rates approaching the capabilities of the device. Other prior art methods, such as use of the Joint Test Action Group (JTAG) interface, are much slower, perhaps by a factor of 10. Other advantages include: the nature of the circuitry on the host PCB is determined automatically by the impedance measuring facilities in the OCRA; the OCRA may be used for more than reading data from memories, such as performing other circuit manipulations for test or reverse engineering purposes, and also collection of digital or analog signature information on the PCB; and the OCRA may be used to detect abnormal system operation, such as the presence of malware or viruses.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising." Moreover, unless specifically stated, any use of the terms first, second, etc., does not denote any order or importance, but rather the terms first, second, etc., are used to distinguish one element from another.

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While various disclosed embodiments have been described above, it should be understood that they have been presented by way of example only, and not limitation. Numerous changes, omissions and/or additions to the subject matter disclosed herein can be made in accordance with the embodiments disclosed herein without departing from the spirit or scope of the embodiments. Also, equivalents may be substituted for elements thereof without departing from the spirit and scope of the embodiments. In addition, while a particular feature may have been disclosed with respect to only one of several implementations, such feature may be combined with one or more other features of the other implementations as may be desired and advantageous for any given or particular application. Furthermore, many modifications may be made to adapt a particular situation or material to the teachings of the embodiments without departing from the scope thereof.

Further, the purpose of the foregoing Abstract is to enable the U.S. Patent and Trademark Office and the public generally and especially the scientists, engineers and practitioners in the relevant art(s) who are not familiar with patent or legal terms or phraseology, to determine quickly from a cursory inspection the nature and essence of this technical disclosure. The Abstract is not intended to be limiting as to the scope of the present disclosure in any way.

Therefore, the breadth and scope of the subject matter provided herein should not be limited by any of the above explicitly described embodiments. Rather, the scope of the embodiments should be defined in accordance with the following claims and their equivalents.

We claim:

1. A device to read data stored on a memory device of a printed circuit board (PCB) while the memory device is installed on the PCB, the device comprising:
   a microcontroller to control acquiring memory data from the memory device when a processor on the PCB is in an idle state wherein the idle state is entered independent of the controller and said control comprising overdriving signals connected to the processor; and
   a resistance measurement and signal driver to measure resistances of signals controlling the memory device and to read the memory data from the memory device;
   wherein the resistance measurement and signal driver further comprise a resistor and a voltage source to measure voltages at the memory device based on at least one logic state, to overcome any driver on the PCB.

2. The device according to claim 1, wherein the microcontroller further controls providing acquired memory data for evaluation.

3. The device according to claim 1, wherein the microcontroller determines when a processor on the PCB is idle prior to acquiring the memory data.

4. The device according to claim 3, wherein the microcontroller measures at least one resistances of a signal controlling the memory device at its interface to the PCB to determine when the at least one resistance is below a threshold prior to acquiring the memory data.

5. The device according to claim 1, further comprising a storage device, located at least one of as a part of the device and at a location remote from the device and the PCB, that stores acquired memory data.

6. The device according to claim 5, further comprising a data interface to enable the acquired memory data to be transferred to the storage device.

7. The device according to claim 1, further comprising a physical interface to connect the device to the memory device.

8. The device according to claim 1, wherein prior to reading the memory data from the memory device, a resistance measurement is taken to ensure that the resistances of the signals at the memory device are high enough to allow acquiring the memory data.

9. The device according to claim 1, further comprising a display to at least one of provide user interfaces and provide status information regarding functionality of the device.

10. A method comprising:
monitoring a processor on a printed circuit board (PCB) for an idle condition by monitoring signals connected from the processor to a memory device;
reading the memory device when the processor is idle with a reader;
measuring pin resistances of signals controlling the memory device on the PCB with the reader;
determining with the reader if all of the resistances are greater than or equal to a critical resistance; and
if all resistances are greater than the critical resistance, reading data from the memory device with the reader.

11. The method according to claim 10, further comprising if any of the resistances are less than a critical resistance, terminating operation of the reader.

12. The method according to claim 10, further comprising storing the data on the reader.

13. The method according to claim 10, further comprising transmitting the data to another location with the reader.

14. The method according to claim 10, further comprising storing the data on an external memory that is at least one of attached to the reader and located remote from the external memory wherein the data is transmitted to the remote location.

15. The method according to claim 10, further comprising determining whether all of the data has been read with the reader.

16. A system, comprising:
a device to read data stored on a memory device of a printed circuit board (PCB) while the memory device is installed on the PCB;
a controller to control acquiring memory data from the memory device when a processor on the PCB is in an idle state wherein the idle state is entered independent of the controller and said control comprising overdriving signals connected to the processor;
a storage device to store acquired memory from the memory device; and
a resistance measurement and signal driver in communication with the controller to measure resistances of signals controlling the memory device and to read the memory data from the memory device;
wherein the resistance measurement and signal driver further comprise a resistor and a voltage source to measure voltages at the memory device based on at least one logic state to overcome any driver on the PCB.

17. The system according to claim 16, wherein when the storage device is remote from the controller, the system further comprises a data interface to enable the acquired memory data to be transferred to the storage device.

* * * * *